United States Patent [19]

Chi et al.

[11] 4,410,817
[45] Oct. 18, 1983

[54] PRECISION TIME DURATION DETECTOR

[75] Inventors: Chao S. Chi, Shrewsbury, Mass.; John W. Craig, Scottsdale, Ariz.

[73] Assignee: Sperry Corporation, New York, N.Y.

[21] Appl. No.: 374,543

[22] Filed: May 3, 1982

Related U.S. Application Data

[63] Continuation of Ser. No. 153,492, May 27, 1980.

[51] Int. Cl.³ ............................................. H03K 5/153
[52] U.S. Cl. .................................... 307/514; 307/351; 307/518; 328/109
[58] Field of Search ................ 328/109, 110; 307/234, 307/514, 517, 351, 518

[56] References Cited

U.S. PATENT DOCUMENTS

| | | | |
|---|---|---|---|
| 3,588,710 | 6/1971 | Masters | 307/514 |
| 3,600,690 | 8/1971 | White | 307/514 |
| 3,646,455 | 2/1972 | Coccagna | 307/514 |
| 3,735,271 | 5/1973 | Leibowitz | 307/234 |
| 3,753,130 | 8/1973 | Pezzutti | 328/110 |
| 4,179,625 | 12/1979 | Carter | 307/234 |
| 4,318,047 | 3/1982 | Dawson | 307/234 |

*Primary Examiner*—John S. Heyman
*Attorney, Agent, or Firm*—Howard P. Terry

[57] ABSTRACT

A detector for determining whether the time duration between a positive and a negative peak of a waveform is greater or less than a predetermined time interval comprises a delay line for delaying the waveform by the predetermined time interval. A peak detector of a first polarity for detecting the first occurring peak of the waveform is responsive to the delayed waveform to provide a signal upon the occurrence of the first occurring peak thereof. A peak detector of a second polarity for detecting the second occurring peak of the waveform is responsive to the undelayed waveform for providing a signal upon the occurrence of the second occurring peak thereof. A time sequence comparator provides a first output indication when the signal from the first peak detector occurs prior to the signal from the second peak detector and a second output indication when the signal from the second peak detector occurs prior to the signal from the first peak detector.

4 Claims, 5 Drawing Figures

PRECISION TIME DURATION DETECTOR

This application is a continuation of application Ser. No. 153,492, filed May 27, 1980.

BACKGROUND OF THE INVENTION

1. Field of the Invention

The present invention relates to time duration or phase discrimination particularly with respect to a time duration or phase detector providing greater accuracy and resolution with accompanying simplicity than has heretofore been achieved in the art.

2. Description of the Prior Art

It is a desideratum in numerous technologies to provide precise time or phase discrimination in a stable and economical manner. For example, in the digital magnetic recording art utilizing READ/WRITE transducers recording on and reproducing from a moving magnetic medium, such as in discs, drums, tape and the like, a data pulse is often recorded by writing a flux transition that saturates the medium in one direction followed by the writing of a flux transition of the opposite polarity to saturate the medium in the opposite direction. Such a writing procedure may be utilized in the well known return-to-zero (RZ) magnetic recording format. When the coventional differentiating read head detects the recorded transition, a waveform approximating Lorentzian shape is generated having a peak of one polarity corresponding to the leading edge of the RZ pulse followed by a peak of the opposite polarity corresponding to the trailing edge of the RZ pulse. In the RZ format, the RZ pulse is representative of one of the binary data states.

Another conventional recording procedure utilizes the non-return-to-zero (NRZ) format wherein one of the binary data states is represented by an isolated flux transition. The read head in response to such a transition provides a waveform having a positive or negative peak depending on whether the write current saturated the medium from negative to positive polarity or from positive to negative polarity respectively.

In these and other recording formats, conventional positive and negative peak detectors provide signals upon the occurrences of the positive and negative peaks of the read waveforms. The opposite polarity peaks of the waveforms may be considered as first and second distinctive events respectively or as respective distinctive points of the waveforms.

In the magnetic recording technology as well as in other arts, information recorded is conveyed on the flux crossovers. It is often necessary to determine whether the time duration between the occurrences of two consecutive peaks of a readback waveform is greater than or less than a predetermined time interval. One type of prior art time duration discriminator utilizes a monostable multivibrator which is triggered to its astable state by the first occurring peak. The return of the monostable multivibrator to its stable state after its characteristic time interval has elapsed is compared to the occurrence of the second peak to provide the desired time interval discrimination. Typically, monostable multivibrator circuits are not sufficiently stable for precise and reliable time interval discrimination. Monostable multivibrators tend to be noise sensitive and do not always trigger at the same point with respect to the first peak. A wide bandwidth device is necessary since the triggering signal is often a steep wide bandwidth digital waveform.

Another prior art approach to time duraton discrimination utilizes a high frequency counting technique. In such an approach the occurrence of the first peak starts a high frequency digital counter and the occurrence of the second peak stops the counter. The number of clock pulses counted in the interval provides a measure of the desired time duration. In order to attain time interval discrimination on the order of several nanoseconds, an accurate start/stop counter operating at an exceedingly high clock rate is necessitated to achieve the desired resolution. Such an approach tends to be exceedingly complex and hence expensive and at the present state of the digital oscillator and counter arts, this approach may not be realizable with available circuitry for nanosecond resolution.

SUMMARY OF THE INVENTION

A stable, precise, bandwidth efficient and economical time duration discriminator that provides discrimination in the nanosecond range detects whether the time duration between first and second events of a waveform is greater than or less than a predetermined time interval. The event can be a peak, a zero cross-over point or a voltage threshold level of the waveform. The first event occurs prior to the second event. The waveform in question is applied to a delay line constructed to provide a time delay precisely equal to the time duration with respect to which the discrimination is desired. The delayed waveform is applied to a first detector for detecting the first event of the delayed waveform and the undelayed waveform is applied to a second detector for detecting the second event of the waveform. The outputs of the first and second event detectors are applied to a time sequence comparator that provides one indication if the output from the first event detector occurs prior to that of the event detector and the opposite indication when the output of the second event detector occurs prior to the output of the first detector. The output of the time sequence comparator indicates whether the time interval between the occurrences of the first and second distinctive events of the waveform is greater than or less than the predetermined time interval.

In an alternative embodiment, the waveform is applied to a detector having two outputs, one output corresponding to the detection of the first event and the second output corresponding to the detection of the second event. The first output signal from the detector is applied to the precision delay device and the output of the precision delay device is applied to the time sequence comparator. The time sequence comparator also receives the second output from the detector. The time sequence comparator provides a time duration discrimination indication in accordance with the time sequence in which the output from the delay device and the second output from the detector occur.

DESCRIPTION OF THE PREFERRED EMBODIMENTS

Figure 1A:
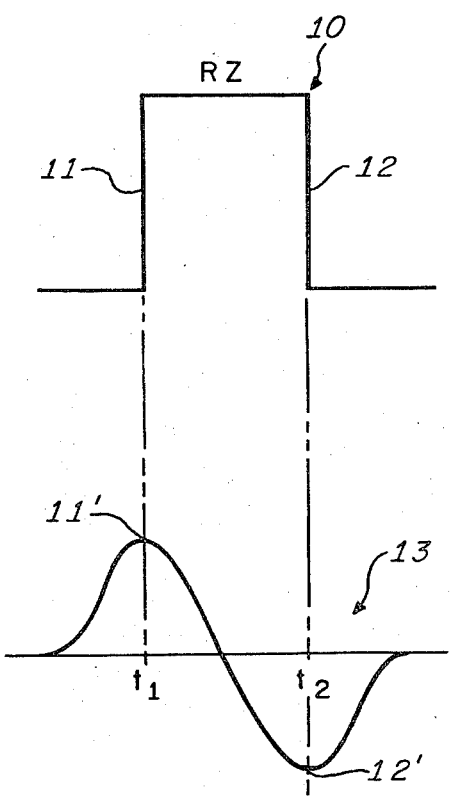
FIGS. 1a and 1b are waveform diagrams depicting the write and read waveforms for RZ and NRZ magnetic recording formats, respectively.

Referring now to FIG. 1a, conventional magnetic recording RZ waveforms are illustrated. Write current waveform 10 comprises a leading edge 11 and a trailing edge 12. The leading edge 11 of the pulse 10 is a rising edge and the trailing edge 12 is a falling edge. The corresponding read waveform from a conventional differentiating read head is illustrated as waveform 13. The waveform 13 has a positive peak 11' corresponding to the positive-going edge 11 and a negative peak 12' corresponding to the negative-going edge 12. The positive peak 11' occurs at a time $t_1$ and the negative peak 12' occurs at a later time $t_2$. Since, with the specific waveforms illustrated in FIG. 1a, the peak 11' occurs prior to the peak 12', the positive peak 11' may be denoted as a first event and the negative peak 12' as a second event of the waveform 13. The peaks 11' and 12' may also be denoted as distinctive points of the waveform. It is appreciated that for a negative-going RZ pulse, the corresponding read waveform would exhibit a negative peak occuring before a positive peak.

Figure 1B:
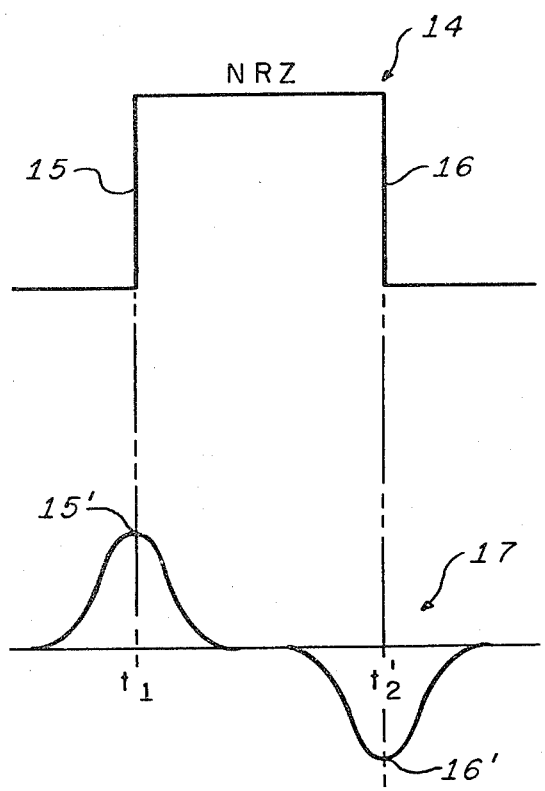

FIG. 1b illustrates write and read waveforms similar to those of FIG. 1a for the NRZ magnetic recording format. The NRZ write pulse 14 illustrated has a rising edge 15 and a falling edge 16. The positive peak 15' and the negative peak 16' of the corresponding read waveform 17 occur at times $t_1$ and $t'_2$.

The waveforms and recording formats discussed with respect to FIGS. 1a and 1b are further described in detail in the textbook *Digital Computer Components and Circuits* by R. K. Richards, published by D. Van Nostrand Company, Inc. in Chapter 7 thereof.

Figure 2:
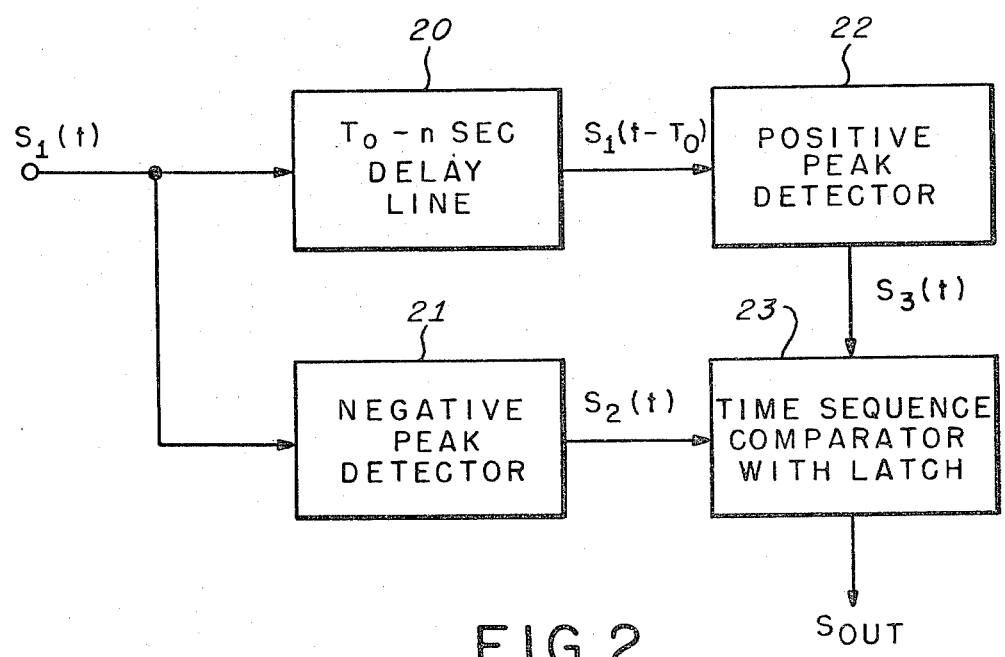
FIG. 2 is a schematic block diagram of a preferred embodiment of the invention.
Figure 3:
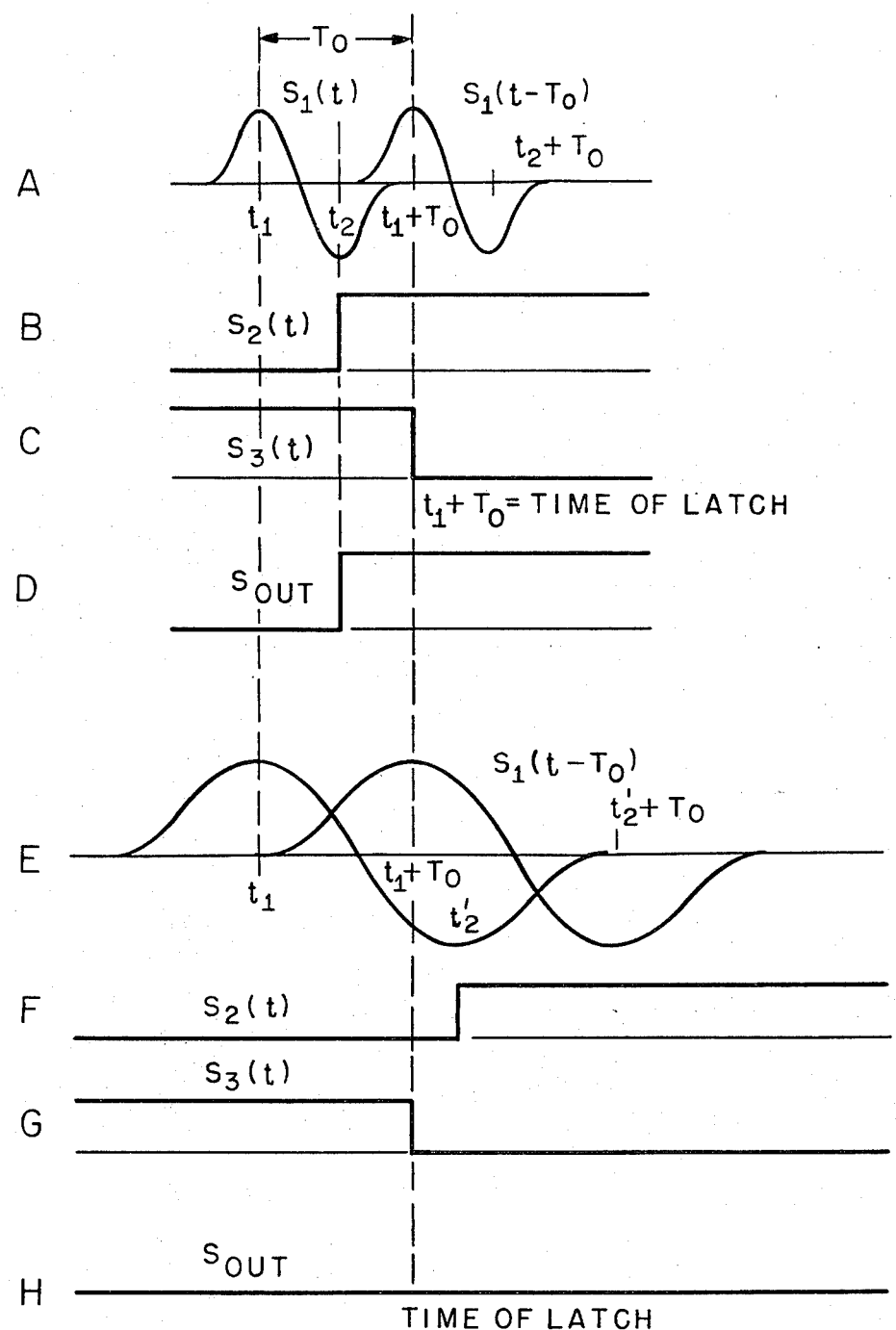
FIG. 3 is a waveform diagram illustrating signals occuring at points of FIG. 2.

Referring to FIG. 2, a time duration or phase detector implemented in accordance with the present invention as illustrated. The FIG. 2 circuit will be explained in terms of input waveforms similar to the waveforms 13 and 17 of FIGS. 1a and 1b. The apparatus of FIG. 2 with respect to the waveform 13, for example, detects whether the time difference $t_2-t_1$ between the peaks 11' and 12' is less than or greater than a predetermined time interval $T_0$. Reference may also be made to FIG. 3 which illustrates waveforms appearing at various points of the apparatus of FIG. 2.

The input waveform, denoted as $S_1(t)$ and depicted on line A of FIG. 3 is applied to a delay line 20 and to a negative peak detector 21. The delay line 20 imparts a precision delay of $T_0$ nanoseconds to the waveform $S_1(t)$, where $T_0$ is the predetermined time interval with respect to which the time difference $t_2-t_1$ between the positive and negative peaks of the waveform is to be discriminated. The delayed output from the delay line 20 is denoted as $S_1(t-T_0)$ and is illustrated on line A of FIG. 3. The output of the negative peak detector 21 is a positive going edge occurring at the time of occurrence $t_2$ of the negative peak of the undelayed waveform $S_1(t)$. The output of the negative peak detector 21 is denoted as $S_2(t)$ and is illustrated on line B of FIG. 3.

The delayed waveform output from the delay line 20 is applied to a positive peak detector 22 that detects the positive peak thereof and provides a negative going edge at the time of occurrence of the positive peak. The output of the positive peak detector 22 is denoted as $S_3(t)$ and is illustrated on line C of FIG. 3. Since the positive peak of the delayed waveform occurs at time $t_1+T_0$ (FIG. 3, line A), the output of the positive peak detector 22 is illustrated as occurring at this time.

The output $S_2(t)$ from the negative peak detector 21 and the output $S_3(t)$ from the positive peak detector 22 are applied to a time sequence comparator 23. The time sequence comparator 23 provides an output $S_{out}$ in accordance with whether the output of the negative peak detector 21 occurred before or after the output of the positive peak detector 22. The output $S_{out}$ from the time sequence comparator 23 is latched by conventional circuitry and is illustrated on line D of FIG. 3. Preferably, the time sequence comparator 23 is configured, in a conventional manner, to be locked into its existing state at the time of occurrence of the output from the positive peak detector 22. Prior to a comparison, the comparator 23 is reset to its low state and is switched to its high state in response to the output of the negative peak detector 21. Thus, when the output from the negative peak detector 21 occurs prior to the output of the positive peak detector 22, the comparator 23 is set to its high state by the $S_2(t)$ signal and is locked into this state by the $S_3(t)$ signal. When, however, the output of the positive peak detector 22 occurs prior to the output of the negative peak detector 21, the $S_3(t)$ signal locks the comparator 23 into its then existing reset state and the subsequent occurrence of the $S_2(t)$ signal does not set the comparator 23 to its high state.

It is appreciated that logic for the comparator 23 for performing the described functions is well within the skill of the routineer. For example, a D-type latch coupled to be set from the output of an AND gate responsive to the $S_2(t)$ and $S_3(t)$ signals will provide the requisite outputs. An alternative arrangement for the time sequence comparator 23 may be effected with an R-S flip flop or a J-K flip flop wherein the inputs to the flip flops are provided by the respective outputs of the detectors 21 and 22. The comparator 23 may be implemented utilizing either digital or analog circuitry. The outputs of the detectors 21 and 22 may be applied to sample and hold circuits and voltage comparators or circuits controlled by the charging and discharging of a capacitor to provide the time sequence comparison function. The positive and negative peak detectors are conventional circuits, a variety of which are well known in the art.

The operation of the apparatus of FIG. 2 will now be described in further detail with reference to FIG. 3. Lines A–D of FIG. 3 illustrate waveforms at various points of FIG. 2 when the time interval $t_2-t_1$ between the positive and negative peaks of the waveform is less than $T_0$. Lines E–H of FIG. 3 illustrate the waveforms at various points of FIG. 2 when the time interval between the positive and the negative peaks of the waveform is greater than $T_0$. The undelayed and delayed waveforms for the two conditions are illustrated on lines A and E and the outputs from the comparator 23 for the two conditions are illustrated on lines D and H. As appreciated from line B, when the waveform $S_2(t)$ from the negative peak detector 21 occurs, the comparator 23 is set since it is not inhibited by the $S_3(t)$ waveform of line C which has not as yet occurred. When under the condition of lines E–H, $S_3(t)$ has occurred prior to $S_2(t)$, the comparator 23 is inhibited from being set by the $S_3(t)$ signal. Thus it is appreciated that when $t_2-t_1 < T_0$, the comparator state is high and when $t_2-t_1 > T_0$, the comparator state is low.

It is appreciated from the foregoing that nanosecond resolutions in time discrimination can be achieved utilizing peak detectors and comparators having the requisite speed and stability and a delay line with delay stability compatible with the desired resolution. It is appreciated that the bandwidth of the delay line 20 need not be any greater than the bandwidth of the input signal. Suitable precision delay lines may be implemented utilizing, for example, L-C networks.

Figure 4:
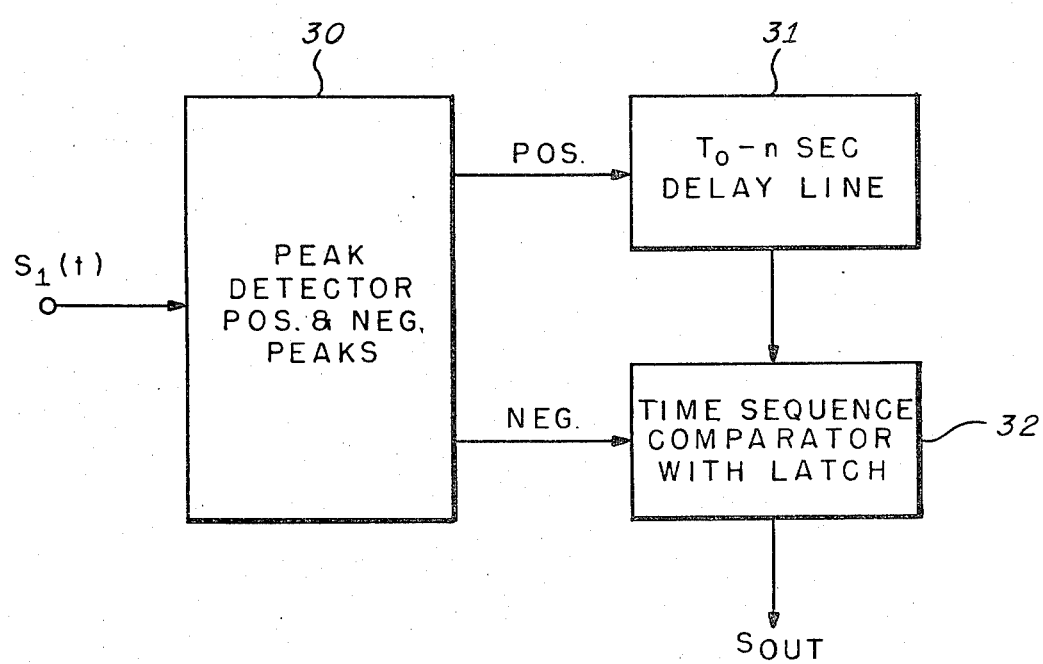
FIG. 4 is a schematic block diagram of an alternative embodiment of the invention.

An alternative embodiment of the invention utilizing less apparatus than that illustrated in FIG. 2 is depicted in FIG. 4. A peak detector 30 responsive to the $S_1(t)$ input waveform provides output signals at the times of occurrence of the positive and negative peaks of the waveform, the two signals being denoted as positive and negative, respectively. The positive peak detection output of the park detector 30 is a negative going edge similar to the $S_3(t)$ waveform illustrated in FIG. 3 and discussed above. The negative peak detection output of the peak detector 30 is a waveform similar to the $S_2(t)$ waveform illustrated in FIG. 3 and discussed above.

The positive peak detection output from the peak detector 30 is applied to a delay line 31 similar to the delay line 20 of FIG. 2. The output from the delay line 31 and the negative peak detection output from the peak detector 30 are applied to time sequence comparator 32 which may be identical to the comparator 23 of FIG. 2. The apparatus of FIG. 4 functions in a manner similar to that described above with respect to FIG. 2 except that the delay line 31 must have a bandwidth commensurate with the digital falling edge signal applied thereto. Thus the bandwidth of the delay line 31 must, therefore, be significantly wider than the bandwidth of the delay line 20.

The above described embodiments of the invention were explained in terms of providing the desired time discrimination for waveforms of the type illustrated in FIGS. 1a and 1b where a positive peak occurs prior to a negative peak. It is appreciated that the precepts of the invention are equally applicable to waveforms in which a negative peak preceeds a positive peak. For such waveforms the positive and negative peak detectors 21 and 22 must be interchanged with respect to each other and the positive and negative peak detection outputs of the peak detector 30 of FIG. 4 must be similarly interchanged. From the foregoing examples, apparatus may be readily constructed that will accommodate waveforms where the order in which the positive and negative peaks occur is arbitrary. Such apparatus may be constructed by utilizing a circuit suitable for one order of occurrence in parallel with a circuit suitable for the other order of occurrence with conventional switching to enable the appropriate circuit. For example, such a device may be configured utilizing the apparatus of FIG. 2 and, in addition, a duplicate set of such apparatus with the positive and negative peak detectors interchanged. A peak detector such as the peak detector 30 of FIG. 4 having its positive and negative peak detection outputs applied directly to a time sequence comparator may be utilized to enable one or the other set of the apparatus in accordance with which of the two peaks occurs first. The outputs from the two sets of the apparatus may be connected in an OR configuration to provide the device output.

The above described embodiments are explained in terms of positive and negative peaks and corresponding positive and negative peak detectors. It is appreciated that the present invention may be utilized with respect to any two points of a waveform that are distinct with respect to each other and where the distinctions may be detected by suitable detectors. For example, in a manner similar to utilizing polarity distinctions as discussed above, amplitude distinctions may also be utilized. Thus depending on the nature of the distinguishing feature of the two points of the waveform, threshold detectors may be utilized instead of peak detectors for suitable applications.

The order of occurrence of the two points of the waveform may also provide the distinguishing feature therebetween. For example, suitable logic may be utilized to detect which of the events is the first to occur and which of the events is the second to occur. The events of the waveform detected on a time distinction basis may be utilized in the manner described above to provide the desired time interval discrimination.

The present invention may be utilized to provide pulse width discrimination. Detectors responsive to the leading and trailing edges of a pulse may be utilized in circuitry similar to that described above for determining whether a pulse is wider or narrower than a predetermined time interval. The leading and trailing edges of the pulse may be suitably differentiated and peak detectors utilized as above described.

It will be appreciated from the foregoing that a simple and economical time duration or phase detector is provided that achieves time duration resolution on the order of nanoseconds. The invention effects precise and stable discrimination between time intervals that may differ by a little as one or more nanoseconds. It is believed that such fine resolution has heretofore not been achieved in as accurate, and width efficient, reliable, stable and economical a device as does the present invention.

While the invention has been described in its preferred embodiments, it is to be understood that the words which have been used are words of description rather than of limitation and that changes may be made within the purview of the appended claims without departing from the true scope and spirit of the invention in its broader aspects.

We claim:

1. Apparatus for detecting whether the time duration between a first and a second peak of an analog waveform is greater or less than a predetermined interval, comprising detector means responsive to said analog waveform for detecting said first peak and for providing a first signal at the time of occurrance thereof and for detecting said second peak and providing a second signal at the time of occurance thereof, delay means for delaying said first signal thereby providing a delayed first signal, and time sequence comparator means coupled to receive said delayed first signal and said second signal for providing a first indication when said delayed first signal occurs prior to said second signal and a second indication when said second signal occurs prior to said delayed first signal.

2. Apparatus as recited in claim 1 wherein, said first peak is a positive peak of said analog waveform and said second peak is a negative peak of said analog waveform.

3. Apparatus as recited in claim 1 wherein said first peak is a negative peak of said analog waveform and said second peak is a positive peak of said analog waveform.

4. Apparatus as recited in claim 1 wherein said delay means includes a passive delay line.

* * * * *